United States Patent
Suh

(10) Patent No.: US 7,628,871 B2
(45) Date of Patent: Dec. 8, 2009

(54) BULK METALLIC GLASS SOLDER MATERIAL

(75) Inventor: Daewoong Suh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 480 days.

(21) Appl. No.: 11/203,546

(22) Filed: Aug. 12, 2005

(65) Prior Publication Data

US 2007/0034305 A1 Feb. 15, 2007

(51) Int. Cl.
C22C 45/00 (2006.01)
B23K 1/00 (2006.01)

(52) U.S. Cl. .................. 148/403; 148/561; 228/262.1

(58) Field of Classification Search ............ 228/179.1, 228/180.1, 180.21, 180.22, 187, 262.1; 148/403, 148/561; 29/840, 843
See application file for complete search history.

(56) References Cited

U.S. PATENT DOCUMENTS

| | | | |
|---|---|---|---|
| 4,222,434 A | 9/1980 | Clyde | |
| 4,377,622 A | 3/1983 | Liebermann | |
| 4,621,031 A * | 11/1986 | Scruggs | 428/627 |
| 4,710,235 A * | 12/1987 | Scruggs | 419/7 |
| 4,901,904 A * | 2/1990 | Tsuno | 228/56.3 |
| 5,232,962 A | 8/1993 | Dershem et al. | |
| 5,482,580 A * | 1/1996 | Scruggs et al. | 148/528 |
| 6,214,480 B1 | 4/2001 | Hosoe | |
| 6,286,206 B1 | 9/2001 | Li | |
| 6,442,040 B2 | 8/2002 | Raad | |
| 6,623,566 B1 | 9/2003 | Senkov et al. | |

(Continued)

FOREIGN PATENT DOCUMENTS

JP 07256482 A 10/2005

(Continued)

OTHER PUBLICATIONS

H. Jones, A perspective on the development of rapid solidification and nonequilibrium processing and its future. Materials Science and Engineering 2001 A304-306 p. 11-19.*

(Continued)

*Primary Examiner*—George Wyszomierski
*Assistant Examiner*—Mark L Shevin
(74) *Attorney, Agent, or Firm*—Blakely, Sokoloff, Taylor & Zafman LLP

(57) ABSTRACT

High strength, reliable bulk metallic glass (BMG) solder materials formed from alloys possessing deep eutectics with asymmetric liquidous slopes. BMG solder materials are stronger and have a higher elastic modulus than, and therefore are less likely than crystalline solder materials to damage fragile low k interlayer dielectric (ILD) materials due to thermal stress in materials with different coefficients of thermal expansion (CTE).

BMG solder materials may physically, electrically, or thermally couple a feature to another feature, or any combination thereof. For example, in an embodiment of the invention, a BMG solder material may physically and electrically couple an electronic component to a printed circuit board. In another embodiment of the invention, a BMG solder material may physically and thermally couple an integrated heat sink to a semiconductor device.

Many embodiments of a BMG solder material are also lead-free, so they comply with lead-free product requirements, while providing a better solution than other lead-free solder materials such as tin-silver-copper.

8 Claims, 6 Drawing Sheets

U.S. PATENT DOCUMENTS

| | | | |
|---|---|---|---|
| 6,756,687 | B1 | 6/2004 | Nguyen |
| 6,809,539 | B2 | 10/2004 | Wada et al. |
| 7,187,068 | B2 | 3/2007 | Suh et al. |
| 2003/0042590 | A1 | 3/2003 | Goller et al. |
| 2003/0164289 | A1* | 9/2003 | Weihs et al. ............ 204/192.12 |
| 2003/0168130 | A1 | 9/2003 | Shohji |
| 2005/0084407 | A1 | 4/2005 | Myrick |
| 2005/0110162 | A1 | 5/2005 | Meyer-Berg et al. |
| 2007/0080451 | A1 | 4/2007 | Suh |
| 2007/0221961 | A1 | 9/2007 | Park et al. |
| 2007/0222050 | A1 | 9/2007 | Lee |
| 2007/0290339 | A1 | 12/2007 | Suh et al. |
| 2009/0032970 | A1 | 2/2009 | Park et al. |
| 2009/0068830 | A1 | 3/2009 | Suh et al. |

FOREIGN PATENT DOCUMENTS

| | | |
|---|---|---|
| TW | 179055 | 2/1992 |
| TW | 436349 | 5/2001 |
| WO | PCT/US2006/029360 | 11/2006 |

OTHER PUBLICATIONS

W.H. Wang et al. Bulk metallic glasses, Materials Science and Engineering R 44 (2004) p. 45-89.*

M. Abtew and G. Selvaduray. Lead-free Solders in Microelectronics. Materials Science and Engineering, 27, (2000), p. 95-141.*

F. Ochoa et al. Effects of Cooling Rate on the Microstructure and Tensile Behavior of a Sn-3.5wt% Ag solder. Journal of Electronic Materials, vol. 32, No. 12, 2003, p. 1414-1420.*

T.G. Nieh et al. Plasticity and structural instability in a bulk metallic glass deformed in the supercooled liquid region, Acta Mater. vol. 49 (2001), p. 2887-2896.*

Wang et al, "Bulk Metallic Glass Formation in the Binary Cu-Zr System", May 17, 2004, American Institute of Physics, Applied Physics Letters, vol. 84, No. 20.

Andersson, C , et al., "Comparison of isothermal mechanical fatigue properties of lead-free solder joints and bulk solders", *ICEPT* (2003), 371-376.

Xiao, Li , et al., "Characterization of mechanical properties of bulk lead free solders", *2000 International Symposium on Advanced Packaging Materials, IEEE*, Mar. 6-8, 2000, Piscataway, NJ, USA, (Mar. 6, 2000), 145-151.

Schroers, Jan , et al., "Amorphous metallic foam", *Applied Physics Letters 82*(3), (Jan. 20, 2003), 370-372.

Taiwan IP Office, ."Office Action" with English translation, Taiwan Patent Application No. 95125108, mailed Nov. 14, 2007, 14 pgs.

Park, Chang-Min, et al., "Stacking of integrated circuits using glassy metal bonding," U.S. Appl. No. 11/831,158, filed Jul. 31, 2007.

Boonrat, Lohwongwatana, et al. "Bulk metallic glasses—alloy compositions survey," U.S. Appl. No. 60/921,805, filed Apr. 4, 2007.

Li Xiao, et al., "Characterization of Mechanical Properties of Bulk Lead Free Solders," Advance Packaging Materials, Proceedings. International Symposium on Mar. 6-8, 2000, Piscataway, NJ, USA, IEEE, Mar. 6, 2000, pp. 145-151.

C Andersson. et al., "Comparison of Isothermal Mechanical Fatigue Properties of Lead-Free Solder Joints and Bulk Solders," Materials Science and Engineering a Structural Materials: Properties, Microstructure & Processing, Luasanne, CH, vol. 394, No. 1-2, Mar. 15, 2005, pp. 20-27.

WIPO "International Preliminary Report on Patentability", PCT/US2006/029360, (Feb. 21, 2008), pp. 1-8.

Sematech Inc., "SEMATECH Official Dictionary, rev. 5.0", *Technology Transfer #91010441C-STD*, (Aug. 31, 1995), p. 145.

USPTO, "Advisory Action", U.S. Appl. No. 11/425,353, mailed Jun. 20, 2008, pp. 1-3.

USPTO, "Final Office Action", U.S. Appl. No. 11/425,353, mailed Mar. 13, 2008, pp. 1-14.

USPTO, "Non-Final Office Action", U.S. Appl. No. 11/425,353, mailed Nov. 29, 2007, pp. 1-12.

Telford, Mark, "The case for bulk metallic glass", *Materials Today*, Elsevier Ltd,(Mar. 2004), pp. 36-43.

USPTO, "Office Action", U.S. Appl. No. 11/831,158, mailed Apr. 29, 2009, 1-7.

USPTO, "Office Action", U.S. Appl. No. 11/425,353, mailed Dec. 31, 2008, 1-16.

USPTO, "Final Office Action", U.S. Appl. No. 11/425,353, mailed Sep. 17, 2009, whole document.

USPTO, "Final Office Action", U.S. Appl. No. 11/831,158, mailed Sep. 10, 2009, whole document.

Swiston, Jr. et al., "Joining bulk metallic glass using reactive multilayer foils," Scripta Materials 2003, 48; pp. 1575-1580.

* cited by examiner

BULK METALLIC GLASS SOLDER MATERIAL

FIELD OF THE INVENTION

The present invention relates generally to the field of semiconductor device packaging. In particular, the present invention relates to a lead-free solder material.

BACKGROUND OF THE INVENTION

Throughout the development of the electronics industry, lead-based solder, primarily tin-lead (Sn—Pb) has been a mainstay material for reliably joining electronic components. Due to its relatively low melting temperature and electrical conductivity, it is well suited for this purpose. However, growing awareness of the toxicity of lead to humans has led to numerous controls on its usage, primarily to prevent it from entering the environment through the waste stream when electronic devices are discarded. Some nations and economic entities have instituted schedules for the mandatory removal of lead from many products, banning import and sale of products containing lead within the near future.

The electronics industry has scrambled to find suitable replacement materials for the lead solder in their products. 'Lead-free' replacement solders, such as SnAg(Cu) are typically stronger than traditional Sn—Pb solders, but they also have a significantly higher melting (reflow) temperature (approximately 230-270° C.) than Sn—Pb (approximately 183° C.). These two properties, combined with other technological developments, have exacerbated the incidence of thermal stress damage in electronic components. During such processes as die attach, thermal stresses develop in the silicon die during solder reflow, frequently damaging 125 the mechanically fragile low k interlayer dielectric 105 (ILD) materials used in current silicon devices. Damage such as cohesive failure 115 (e.g. cracking) within a solder joint or solder ball 104, or adhesive failure 120 (e.g. delamination) between a solder ball 104 and a pad 103 of either a substrate 102 or a semiconductor device 101, may also be more common problems when using lead-free solders. Next generation ILD materials are expected to be even more fragile, and problems from thermally induced stress damage are expected to become even more pronounced.

Thermal fatigue is also a significant reliability concern. During manufacturing and normal use, solder materials and other materials within electronic devices are subjected to thermal cycling. When the coefficients of thermal expansion (CTE) of solder and other materials in a device are mismatched, solder joints may be subjected to inelastic strain accumulation, thermal fatigue, and eventually, damage such as fatigue crack growth.

With deadlines approaching for providing lead-free products to markets requiring them, the electronics industry continues to try to develop reliable, lead-free solder materials that are less susceptible to many failure mechanisms observed with current lead free solder materials, as well as some lead-containing solders.

DETAILED DESCRIPTION OF THE INVENTION

Figure 1:
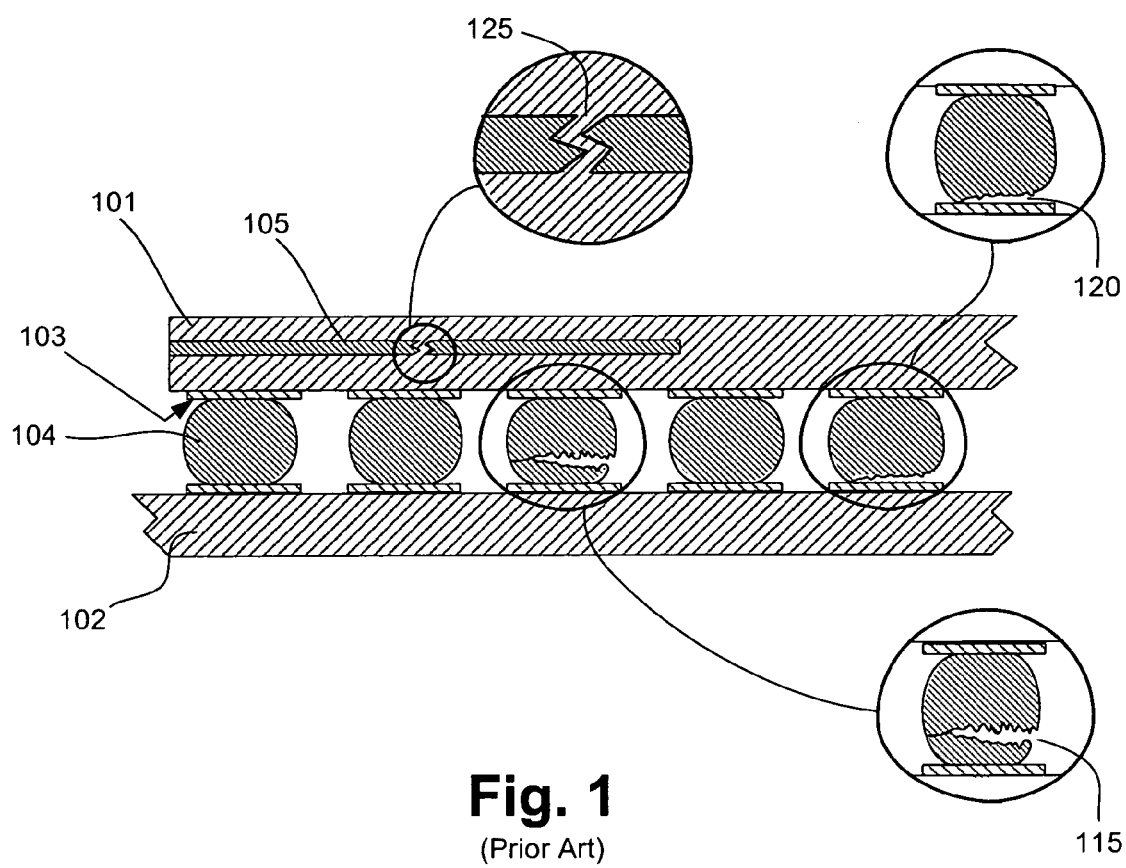
FIG. 1 depicts a cross-sectional view of damaged solder balls of a semiconductor device assembled to a substrate, according to the prior art.
Figure 2:
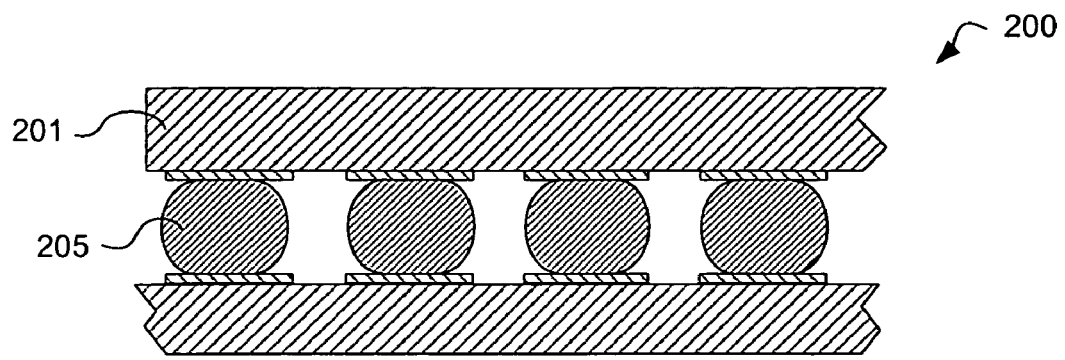
FIG. 2 depicts a cross-sectional view of a semiconductor device assembled to a substrate by bulk metallic glass solder balls according to embodiments of the invention.
Figure 3:
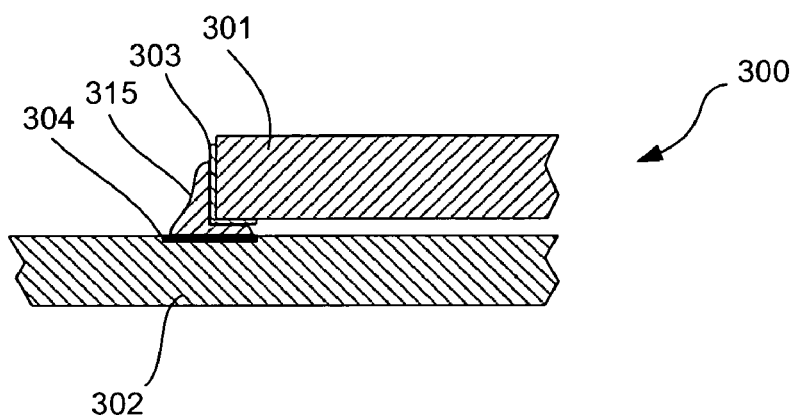
FIG. 3 depicts a cross-sectional view of a surface mount component assembled to a substrate by a bulk metallic glass solder material according to embodiments of the invention.
Figure 4A:
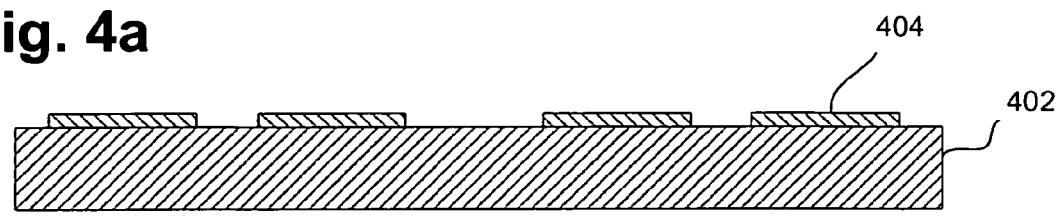
FIGS. 4a-4d depict in cross-sectional view a method for assembling surface mount components to a substrate using a bulk metallic glass solder material according to embodiments of the invention.
Figure 4B:
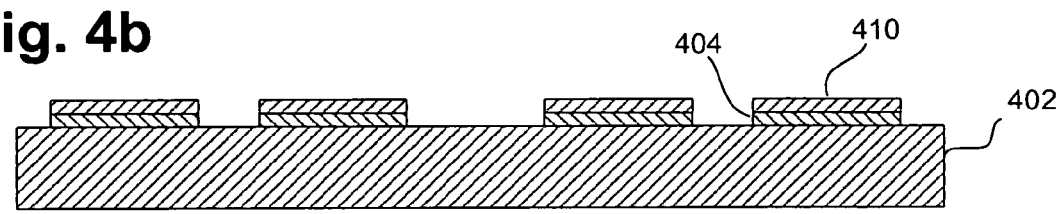
Figure 4C:
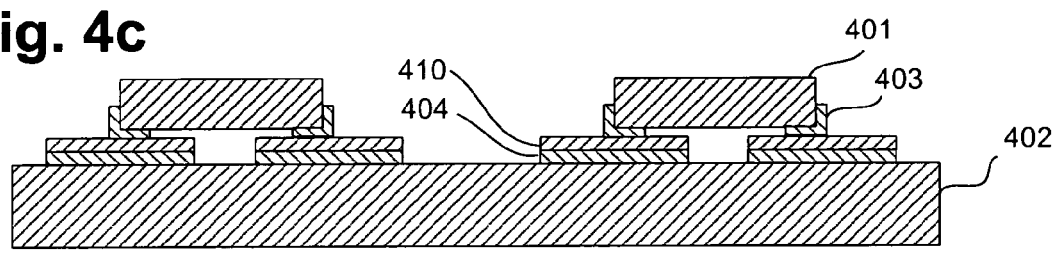
Figure 4D:
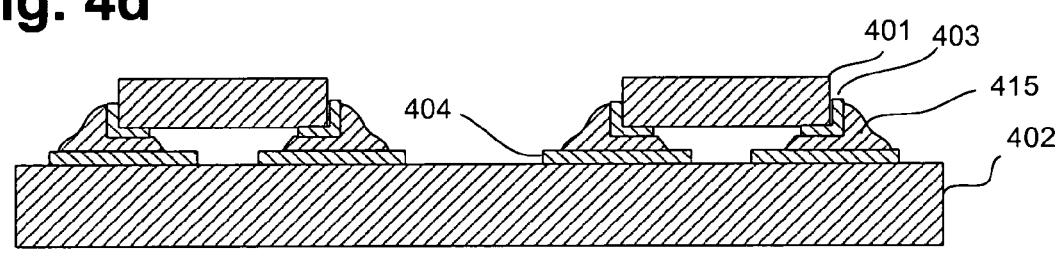
Figure 5A:
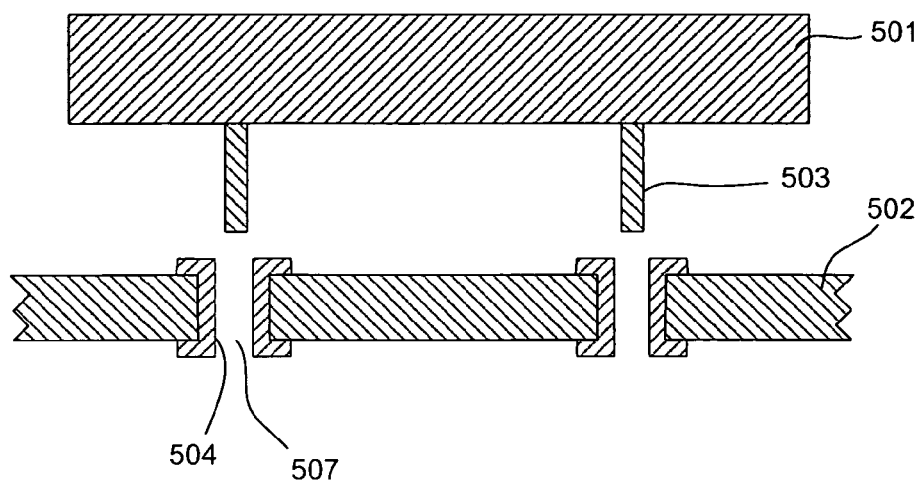
FIGS. 5a and 5b depict in cross-sectional view a method for assembling a through hole mount component to a substrate using a bulk metallic glass solder material according to an embodiment of the invention.
Figure 5B:
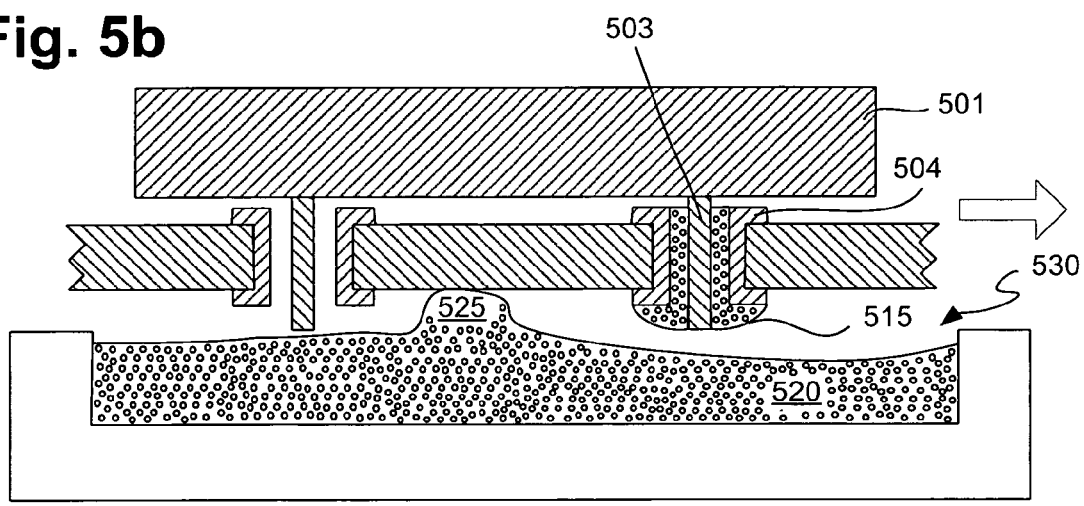
Figure 6A:
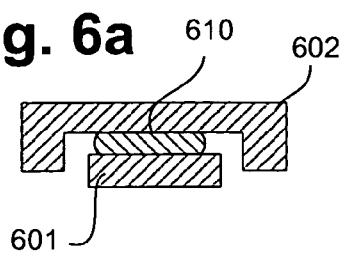
FIGS. 6a-6c depict cross-sectional views of a bulk metallic glass solder material as a thermal interface material according to embodiments of the invention.
Figure 6B:
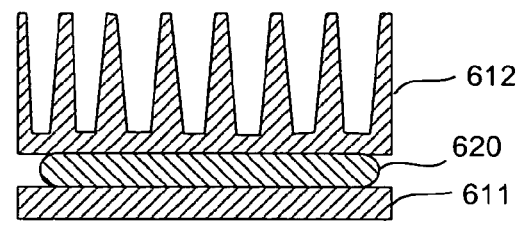
Figure 6C:
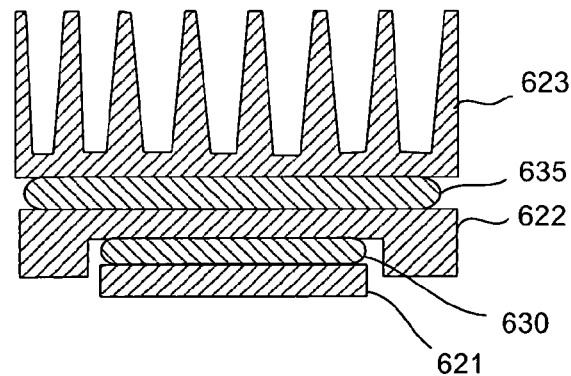

Embodiments of the invention describe a solder material comprising bulk metallic glass (BMG) alloys. Conventional metallic glasses typically crystallize when cooled to their melting temperature ($T_m$) unless cooled at exceedingly high rates, for example >$10^{5°}$ C./second. Such high rates of thermal transfer require specialized and costly equipment and conditions, and limit the size of items that may be formed as typical metallic glass to only very thin wires and ribbons. However, upon cooling, BMG materials bypass crystallization and instead go through a large supercooled region wherein the molten BMG is exceptionally stable against crystallization. While in this supercooled region, BMG exhibits Newtonian viscous behavior, or perfect superplasticity (m=1), while conventional superplastic metals have an m value of less than 0.6. BMG alloys may bypass crystallization and undergo glass formation at relatively slow cooling rates, such as <$10^{2°}$ C./second, which are attainable using current reflow methods.

These characteristics give BMG materials their enhanced glass forming ability, and slow crystallization tendencies. However, once formed into a solid, glassy state, BMG materials are very strong and tough, while also being ductile and possessing an extraordinarily high elastic strain limit. These post-reflow characteristics of BMG materials make them well suited for use as a solder compound in semiconductor device manufacturing.

Whereas typical lead-free solder compounds, such as SnAg(Cu), lock in inelastic thermal stresses at the moment of crystalline solidification, usually at or near $T_m$, BMG materials do not lock in thermal stresses until the lower temperature of glass formation ($T_g$). Therefore, where there is a CTE mismatch between the solder and the materials to which it is attached, the thermal strain generated during cooling will accumulate across a larger temperature differential in traditional lead-free solders than for BMG materials, as the thermal difference between room temperature and $T_m$ is greater than that between room temperature and $T_g$.

Is addition to generating less thermal strain during cooling, BMG materials have a much higher elastic strain limit (approx. 2%) than the typically used rigid, crystal forming lead free solders (approx. 0.1%). Therefore, a greater amount of any strain resident in the system can be taken up by a BMG solder, imposing less total strain upon the materials being joined by the solder. Therefore, the lower resulting thermal strain resident in semiconductor devices, wherein BMG solders are used according to embodiments of the invention, present less potential for damage to the delicate low k dielectric materials used now and in the future.

Eutectic alloys are those with a melting point that is lower than the melting point of their constituents, and a deep eutectic is a melting point of an alloy that is substantially lower than those of its constituents. In an exemplary embodiment, the deep eutectic of an alloy may be approximately 25% lower than the melting point of its constituents. In other embodiments, a deep eutectic may be more than 25% lower than the melting points of the constituents. Alloys possessing deep eutectics, especially with an asymmetric liquidous (when a metal becomes completely liquid) around a eutectic point, have recently been shown to produce BMG alloys. As with other vitreous materials, BMG alloys do not typically form ordered crystalline matrices when solidifying at or below the glass transition temperature ("vitrification"). Rather, the arrangement of atoms in a BMG material is substantially amorphous and disordered.

A 'binary' alloy (containing two constituent elements, or 'constituents'), including tin (Sn), used as a solder material according to exemplary embodiments of the invention, may include tin-bismuth (Sn—Bi), where a composition capable of forming a bulk metallic glass solder material may be found within the range of approximately 30-53% tin by weight (wt. %). Ordinary experimentation may be used to identify exact compositions, which may be found at even a 0.1% increment of wt. % within the stated range. Likewise, bulk metallic glass solder may be formed within the following alloys and composition ranges: tin-indium (Sn—In; 45-60 wt. % Sn), tin-zinc (Sn—Zn; 80-92 wt. % Sn), tin-nickel (Sn—Ni; 95-99.9 wt. % Sn), tin-copper (Sn—Cu; 95-99.9 wt. % Sn), tin-silver (Sn—Ag; 90-98 wt. % Sn), tin-aluminum (Sn—Al 95-99.9 wt. % Sn), tin-arsenic (Sn—As; 95-99.9 wt. %), tin-gold (Sn—Au; 80-95 wt. % Sn), tin-cadmium (Sn—Cd; 60-70 wt. % Sn), tin-dysprosium (Sn—Dy; 95-99 wt. % Sn), tin-magnesium (Sn—Mg; 80-90 wt. % Sn), tin-lead (Sn—Pb; 55-70 wt. % Sn), and tin-thallium (Sn—Th; 50-65 wt. % Sn).

According to other exemplary embodiments, BMG solder materials may be found within binary alloys and composition ranges including indium, such as indium-bismuth (In—Bi; 60-70 wt. % In), indium-zinc (In—Zn; 97-99 wt. % In), indium-nickel (In—Ni; >99 wt % In), indium-copper (In—Cu; >99 wt % In), indium-silver (In—Ag; 95-99 wt. % In), and indium-gold (In—Au; >99 wt % In), indium-cadmium (In—Cd; 60-70 wt. % In), or indium-gallium (In—Ga; 20-30 wt. % In).

Likewise, 'ternary' alloys (alloys containing three constituent elements) that may also be used as BMG solder materials. Examples of ternary alloys according to embodiments of the invention include tin-indium-bismuth (Sn—In—Bi), tin-indium-zinc (Sn—In—Zn), tin-bismuth-zinc (Sn—Bi—Zn), indium-bismuth-zinc (In—Bi—Zn), tin-silver-copper (Sn—Ag—Cu), tin-silver-nickel (Sn—Ag—Ni), tin-copper-bismuth (Sn—Cu—Bi), and tin-copper-indium (Sn—Cu—In).

It should be understood that the listed binary and ternary alloys are only exemplary embodiments, and not a full listing of all binary and ternary alloys that may be used as BMG solder materials according to embodiments of the invention. The listed alloys share the characteristics of having deep eutectics with asymmetric liquidous lines. Therefore, it should be understood from this description that other alloys having similar characteristics of a deep eutectic with asymmetric liquidous points, may likewise be used as BMG solder materials according to embodiments of the invention.

For ternary or 'higher-order' alloys (alloys with more than three constituents), commercially available software such as 'Thermo-Calc Classic' (TCC) or 'Thermo-Calc Windows' (TCW) from Thermo-calc Software, Inc. may be used to map out and identify composition ranges in which may be found deep eutectic regions. Then, by ordinary experimentation, as described above for binary systems, exact composition ranges useful for BMG alloys may be identified within the composition ranges.

In embodiments, the specific compositions of BMG alloys may be selected so that the operating temperature of an apparatus incorporating BMG solder materials is not significantly higher than the $T_g$ of the BMG alloy used. In various embodiments, the $T_g$ may vary, so a Time-Temperature-Transformation diagram may be used to determine appropriate operating temperature limits for using BMG alloys according to embodiments. In general, the use condition should not exceed the 'nose' of the "C" curve in a Time-Temperature-Transformation diagram, where crystallization time is plotted as a function of temperature. For example, if a BMG alloy is selected for use in an apparatus wherein the operating temperatures may significantly exceed the $T_g$ of the solder system, the BMG solder materials may crystallize. Therefore, selecting a BMG alloy with a $T_g$ not significantly lower than the operating temperature may be beneficial.

However, in some applications, exceeding the $T_g$ of a BMG solder material may be beneficial. In an exemplary embodiment, a normally open power circuit switch may be soldered closed with a BMG solder material. If the operating temperature exceeds a maximum allowed temperature, thus creating a dangerous situation, the BMG solder material may soften, allowing the circuit to open, cutting off power to the apparatus. Therefore, it should be understood that the composition of an alloy for a BMG solder material may be selected for a beneficial $T_g$ depending upon the application.

Altering the percentage composition of the constituents of an alloy may change the $T_g$ and $T_m$ for the resulting alloy. Therefore, it should be appreciated that a great number of compositions of BMG alloys may be formed according to embodiments of the invention; the possible compositions are too numerous to list herein.

BMG solder materials according to embodiments of the invention may take numerous forms and include a broad array of applications. According to embodiments, solder spheres (solder balls) may be formed from an alloy capable of forming BMG solder joints after reflow. In one such embodiment 200, BMG solder spheres 205 may be used for ball grid array (BGA) component 201 attachment. In another embodiment, they may be incorporated into a BMG solder paste. A BMG solder paste may be provided in contact with attachment features 303 of a component 301 and with attachment features 304 of a substrate 302, forming a BMG solder fillet 315 firmly connecting the component 301 to the substrate 302 after reflow. In another embodiment, a similar paste may include a BMG powder rather than BMG spheres.

Conventional solder sphere and powder/paste reflow processing parameters are readily applicable to the use of BMG-based solders, as BMG-based solder materials do not require a fast cooling rate as do many metallic glass compounds. Therefore, BMG-based solder spheres may be used for ball attachment, and BMG-based solder paste may be used for paste printing using current processing parameters and equipment. Solder fillets may be formed using BMG solder paste for connecting components to a substrate, as in one exemplary embodiment, to connect components such as capacitors, resistors, and other similar electronic components to a printed circuit board (PCB).

According to an exemplary embodiment shown in FIGS. 4a-4d, BMG solder paste 410 may be printed onto the surface of a substrate 402 by screen printing, stencil printing, manual application or other methods, so that the paste deposits only onto the areas or features 404 of the substrate 402 surface as desired or as dictated by design information, where components 401 may be surface mounted onto a substrate 402. After the BMG solder paste 410 is deposited onto a conductive feature 404 on a substrate 402 surface, and a component 401 is placed onto the substrate 402 surface so that external electrically conductive terminals 403 or attachment features of the component are in contact with the BMG solder 410, the solder 410 is heated to or above its melting temperature $T_m$ causing the BMG solder material 410 to melt and reflow. The BMG solder material 410 is then cooled below its $T_m$ to its $T_g$, solidifying as a conductive metallic glass fillet 415 connecting the component 401 to the surface of the substrate 402.

In embodiments, examples of conductive features on the surface of a substrate may include pads, vias, exposed traces, exposed power or ground planes, terminals of embedded components, or others as may be provided. Examples of electrically conductive terminals of a component may include stamped metal leads, pins, pads, formed metal end terminals, or others as may be provided. Any of the examples of electrically conductive terminals of a component may also function as an attachment feature, however, in embodiments, they may be present on a component solely for attachment purposes, and may not electrically communicate with either the substrate or with the component. Likewise, conductive features on the surface of a substrate may not be electrically connected to any other conductive features of a substrate, thereby being effectively electrically isolated. In this situation, they may only serve as attachment features on the surface of a substrate.

Reflow of a surface mount BMG solder material may be accomplished by exposing the material to elevated temperatures within a reflow oven, or by applying more localized heating, such as by a soldering iron or laser, whereby the heat source is applied to the same surface of the substrate as that upon which the BMG solder material resides. A substrate may also be placed on or above a heat source, such as a hot plate, an open flame, or by some other means wherein the heat is applied to a surface of the substrate other than that upon which the BMG solder material resides, and the heat is conducted through the substrate. In the various embodiments wherein heating is applied generally or locally, or to the same or different surfaces of a substrate as that upon which BMG solder material resides, the heat source should be sufficient to raise the BMG solder material above its $T_m$ and cause it to reflow.

As described in the foregoing embodiments, BMG solder materials may be used for surface mounting components to the surface of a substrate. However, in other embodiments, BMG solder materials may also be used to connect 'through hole mount' components to a substrate. Typically, through hole mounted components 501 have metallic pins 503 or other features that extend outward (protrude) from the component 501. A through hole mounted component 501 will be placed proximate a substrate 502 so that one or more of the protruding features 503 partially or fully extend through a hole 507 provided in the substrate 502. The hole 507 may be provided with a metallic layer 504 on its inner surface to facilitate bonding with a solder material for secure attachment of the component 501, and the metallic layer 504 may additionally electrically communicate with one or more conductive layers of the substrate 502. Thus, a metallic layer 504 so disposed may function as an attachment feature of a substrate 502, or as a conductive feature, or both.

Attachment is typically achieved by exposing the side of the substrate 502 opposite the component to a quantity of molten BMG solder material 520. Some BMG solder material 512 wicks into the hole 507 and partially or fully fills the interstitial space between the metallic layer 504 on the inner surface of the hole and the protruding attachment feature 503 of the component 501. When the solder material 512 in the hole 507 cools below its $T_m$, it solidifies firmly connecting the component 501 to the substrate 502. A solder fillet 515 often also forms around the portion of a protruding attachment feature 503 that extends fully through and beyond the surface of the substrate 502 opposite the surface proximate to which the component 501 is placed. A solder fillet 515 so formed, when cooled and solidified, may be sufficient to bond a component 501 to a substrate 502 even absent solder 512 filling the interstitial space of the hole 507 as described.

The quantity of solder 520 to which the substrate 502 is exposed, to affect through hole mounting as described, may be a static bath of molten solder material. More typically in electronic component manufacturing is a 'wave solder bath' 530 of molten solder material 520, with a standing wave 525 provided above the surface of the bath 530 that contacts the surface of a substrate 502 passing over the bath 530. Solder contacting the surface of the substrate 502 may remain on the substrate 502 as described even after removed from contact with the standing wave 525 of solder material 520. As may be appreciated, molten solder material may be provided by other means to affect through hole mounting of components to a substrate.

In embodiments of the invention, BMG solder materials may provide through hole attachment of components to a substrate. In one such embodiment, BMG solder materials may comprise the molten solder material for a wave solder apparatus and process. In another embodiment, BMG solder materials may comprise the molten solder material in a static bath used for through hole attachment of components. In still other embodiments, such as manual soldering or automated (e.g. robotic) soldering, BMG solder may be applied in the form of a bar, paste, powder, a ribbon, a flexible wire or other solid or liquid unit as may facilitate delivery of the BMG solder material for a soldering application to connect through hole mount components to a substrate.

The forms of BMG solder described here are not limited to use only in attaching through hole mount components, but may also be used in other applications where disposing solder upon an attachment feature may be usefully accomplished using one of the described forms. For example, the described forms of BMG solder may be used in embodiments to connect a surface mount component to a substrate. Likewise, it should also be understood that BMG solder spheres as mentioned in embodiments of the invention may represent only an exemplary embodiment, and in other embodiments, the BMG solder may be cuboid, cylindrical, or some other geometric shape or amorphous configuration rather than spherical, otherwise utilized as discrete, typically fairly small individual units. For simplicity of description, an individual unit of BMG solder material, including any of a multiplicity of shapes or forms, may be referred to herein as a "pellet". Thus, it may also be understood that in embodiments where a sphere of BMG solder material may be used, it may also be possible in embodiments for a pellet of BMG solder material to be used.

Likewise, a bar of solder may possess in embodiments any of numerous cross-sectional shapes or forms, including circular, triangular, square, rectangular, ovoid, trapezoidal, or others. Nor may a cross-sectional shape of a bar limited to only geometric shapes, but embodiments may also include amorphous cross-sectional shapes or configurations possessing either many sides or no defined sides. In embodiments, a bar of solder may also be solid, or hollow, or porous. Therefore, a bar of solder material as described in embodiments of the invention may encompass what may be also be described as a rod, a stick, an ingot, a beam, a nugget, a tube, or other such configurations.

A liquid unit of solder according to embodiments of the invention may include a quantity of molten solder. It may also include a liquid carrier material in which is found a BMG solder material that may be dispensed with the liquid carrier material. In embodiments including a liquid carrier material, the BMG solder material may take the form of a suspension of very small individual BMG solder particles, or of a low viscosity mixture of solder paste and a carrier material than may function similarly to an emulsifying agent.

In other embodiments of a BMG solder material attaching a component to a substrate, a component may be a conductive wire, strap, cable, or similar apparatus. A component may also be an attachment device such as a post, a bolt, a stud, a latch, a clip, or other similar physical connection component. A component may in other embodiments include connectors used to receive and retain cables (e.g. power supply cables, drive cables (hard drive, DVD drive, etc.), jumper cables, optical cables, etc.) 'slot connectors' used to receive and retain card-based devices (e.g. memory cards, I/O cards, graphics cards, etc.), or sockets used to receive and retain semiconductor devices (e.g. pin grid array (PGA) sockets, land grid array (LGA) sockets, etc.). Numerous other embodiments may include a multitude of individual parts that may be physically attached to a substrate, such as a printed circuit board, as components. In such embodiments, a component may be considered a surface mount component when it is attached primarily to a feature located on or at the surface of a substrate. A component may be considered a through hole mount component if a feature of the component protrudes substantially through the surface of a substrate proximate the component, into or through a hole provided in the substrate.

Another embodiment wherein BMG solder material is both novel and beneficial is as a thermal interface material (TIM) 610, 620, 630 provided between a heat generating device such as a semiconductor chip or a semiconductor package (collectively herein, "semiconductor device") 601, 611, 621, and a thermal dissipation device (cooling device) such as a integrated heat spreader (IHS) 602, 622, heat sink 612, thermoelectric cooler, a fan apparatus, a liquid cooling unit, a refrigeration unit, a multiphase cooling unit (a heat pipe or other cooling device based on phase change of a cooling medium) or other such apparatuses. In another embodiment, a BMG solder material may be provided as a TIM between a first cooling device and a second cooling device. In one such exemplary embodiment, a BMG solder 635 may be disposed between a IHS 622 and a heat sink 623, wherein the BMG solder 635 serves both to connect the heat sink 623 to the IHS 622, and also to facilitate thermal conduction between the IHS 622 and the heat sink 623. BMG solders may have high thermal conductivity, making them suitable for applications where thermal conduction is a substantial consideration.

When used as a TIM, BMG solder materials also provide benefits in maintaining a close and secure bond between materials having differing CTE values, preventing cracking or delamination that could interfere with efficient thermal transfer. Thus, while physically coupling a heat generating device and a cooling device, or two cooling devices, a TIM including a BMG solder material also thermally couples said devices.

Accordingly in exemplary embodiments of the invention, BMG solder materials may be disposed between a semiconductor device and a cooling device so that a bond is formed over a substantial surface area of both the semiconductor device and the cooling device. The BMG solder material may be applied initially in solid form to either a cooling device or a semiconductor device, then reflowed and allowed to cool to or below the $T_g$ while in substantial contact with surface areas of both devices. Alternately, embodiments may include disposing molten BMG solder materials onto either a cooling device or a semiconductor device, bringing the devices together so that substantial surface areas of both devices are in contact with the BMG solder material, then cooling the BMG solder material to or below the $T_g$.

Embodiments may also include disposing BMG solder materials onto either a cooling device or a semiconductor device as a paste, a powder, a thick film (e.g. a sheet), a thin film (e.g. a tape), or another physical state or form that allows controlled placement and does not impair the reflow, vitrification, adhesion, or thermal conduction properties of the BMG solder. As in other embodiments, the BMG solder will be reflowed and allowed to cool to or below its $T_g$ while in substantial contact with surface areas of both the cooling device and the semiconductor device. Within the described embodiments, it may be understood that the surface areas of a cooling device and a semiconductor in adhesive contact with a BMG solder material may be considered attachment features for descriptive purposes.

As the normal operation of a semiconductor device and cooling device includes thermal cycling and thermal differentials, and materials with disparate CTEs may be involved, the higher elastic strain and toughness of BMG solder materials provide benefits as a TIM in a great many such applications by preventing the types of damage mentioned earlier in this description. Therefore, different alloys and compositions may be chosen for a BMG solder material based on the CTE values of the materials to be joined by the BMG solder, and by the operating temperatures or processing temperatures those materials may be subjected to in the course of assembly or normal use.

Although a detailed description has been provided regarding using BMG solder material as a TIM between a cooling device and a semiconductor device, it should be understood that this discussion is likewise applicable to a BMG solder material used as a TIM between a first cooling device and a second cooling device, such as in an exemplary embodiment, between an IHS and a heat sink.

Figure 7:
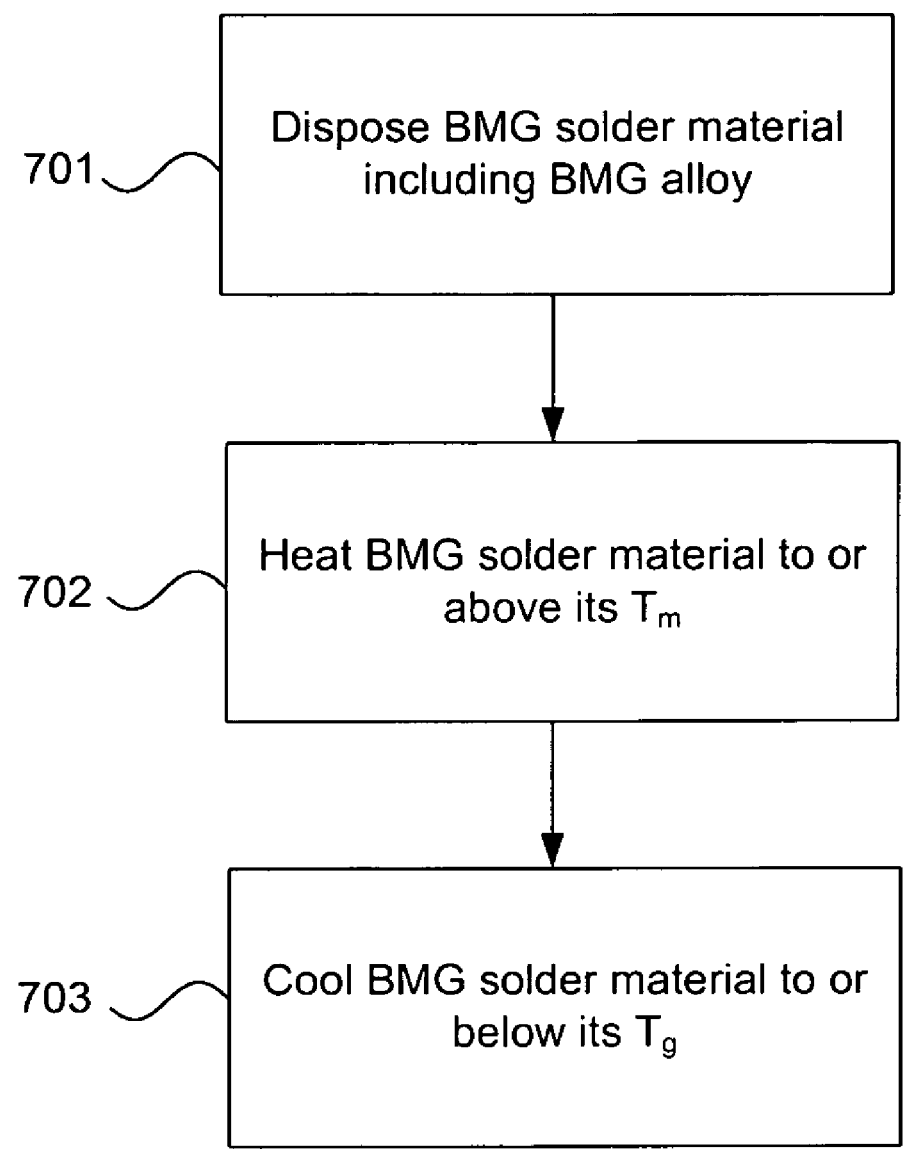
FIG. 7 depicts a block diagram of a process for using a bulk metallic glass solder material to connect (attach) two features.

Thus, as substantially described herein, and as shown in FIG. 7, embodiments of the invention include a method for using bulk metallic glass (BMG) alloys as a solder material. Generally, this includes disposing a BMG solder material so that it is in contact with at least a first feature and a second feature 701, heating the BMG solder material containing the BMG alloy to or above its melting temperature ($T_m$) 702, then cooling the BMG solder material to or below its glass transition temperature ($T_g$) 703 forming a BMG solder joint connecting the first feature to the second feature. Alternatively, a BMG solder material may be disposed in contact only with a first feature, but so that it will come into contact with a second feature when it is heated above its melting temperature. In still another embodiment, a BMG solder material may be disposed in contact only with a first feature, then a second feature may be disposed in contact with the BMG solder material. The first and second features may be individual components or devices, or they may be structural elements incorporated as a portion of a component, device or substrate, such as but not limited to an electronic component, a semiconductor device, a cooling device, or a printed circuit board according to embodiments described herein.

It should also be noted that BMG solder materials, once reflowed, may be optionally annealed at temperatures well above $T_g$, but below $T_m$, to produce partial to perfect nanocrystal solders.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

What is claimed is:

1. An article of manufacture, comprising:
   a substrate;
   a component; and
   a bulk metallic glass solder material physically coupling the substrate to the component, wherein the bulk metallic glass solder material has an alloy composition which undergoes glass formation when the solder material is cooled from at or above the melting temperature ($T_m$) to at or below the glass transition temperature (Tg) at a cooling rate below approximately $10^{2}°$ C./second, and wherein the bulk metallic glass solder material comprises an alloy including at least one of tin-indium including 45-60 wt. % tin, tin-zinc including 80-92 wt. % tin, tin-nickel including 95-99.9 wt. % tin, tin-copper including 95-99.9 wt. % tin, tin-silver including 90-98 wt. % tin, tin-aluminum including 95-99.9 wt. % tin, tin-arsenic including 95-99.9 wt. % tin, tin-gold including 80-95 wt. % tin, tin-cadmium including 60-70 wt. % tin, tin-dysprosium including 95-99 wt. % tin, tin-magnesium including 80-90 wt. % tin, tin-lead including 55-70 wt. % tin, tin-thallium including 50-65 wt. % tin, indium-bismuth including 60-70 wt. % indium, indium-zinc including 97-99 wt. % indium, indium-nickel including >99 wt % indium, indium-copper including >99 wt %, indium-silver including 95-99 wt. % indium, and indium-gold including >99 wt %, indium-cadmium including 60-70 wt. % indium, and indium-gallium including 20-30 wt. % indium.

2. An article of manufacture, comprising:
   a first device;
   a second device; and
   a bulk metallic glass solder material disposed in substantial contact with the first device and the second device to physically couple the two devices, wherein the bulk metallic glass solder material has an alloy composition which undergoes glass formation when the solder material is cooled from at or above the melting temperature ($T_m$) to at or below the glass transition temperature (Tg) at a cooling rate below approximately $10^{2}°$ C./second, and wherein the bulk metallic glass solder material comprises an alloy including at least one of tin-indium including 45-60 wt. % tin, tin-zinc including 80-92 wt % tin, tin-nickel including 95-99.9 wt. % tin, tin-copper including 95-99.9 wt. % tin, tin-silver including 90-98 wt. % tin, tin-aluminum including 95-99.9 wt. % tin, tin-arsenic including 95-99.9 wt. % tin, tin-gold including 80-95 wt. % tin, tin-cadmium including 60-70 wt. % tin, tin-dysprosium including 95-99 wt. % tin, tin-magnesium including 80-90 wt. % tin, tin-lead including 55-70 wt. % tin, tin-thallium including 50-65 wt. % tin, indium-bismuth including 60-70 wt. % indium, indium-zinc including 97-99 wt. % indium, indium-nickel including >99 wt % indium, indium-copper including >99 wt % indium, indium-silver including 95-99 wt. % indium, and indium-gold including >99 wt % indium, indium-cadmium including 60-70 wt. % indium, and indium-gallium including 20-30 wt. % indium.

3. An article of manufacture, comprising:
   a substrate;
   a component; and
   a bulk metallic glass solder material physically coupling the substrate to the component, wherein the bulk metallic glass solder material has an alloy composition which undergoes glass formation when the solder material is cooled from at or above the melting temperature ($T_m$) to at or below the glass transition temperature (Tg) at a cooling rate below approximately $10^{2}°$ C./second, and wherein the bulk metallic glass solder material comprises a ternary alloy including at least one of tin (Sn) and indium (In).

4. The article of manufacture of claim 3, wherein the bulk metallic glass solder material further comprises two of bismuth (Bi), zinc (Zn), nickel (Ni), copper (Cu), and silver (Ag).

5. An article of manufacture, comprising:
   a substrate;
   a component; and
   a bulk metallic glass solder material physically coupling the substrate to the component, wherein the bulk metallic glass solder material has an alloy composition which undergoes glass formation when the solder material is cooled from at or above the melting temperature ($T_m$) to at or below the glass transition temperature (Tg) at a cooling rate below approximately $10^{2}°$ C./second, and wherein the bulk metallic glass solder material comprises an alloy including at least one of indium-bismuth including 60-70 wt. % indium, indium-zinc including 97-99 wt. % indium, indium-nickel including >99 wt % indium, indium-copper including >99 wt % indium, indium-silver including 95-99 wt. % indium, and indium-gold including >99 wt % indium, indium-cadmium including 60-70 wt. % indium, and indium-gallium including 20-30 wt. % indium.

6. An article of manufacture, comprising:
   a first device;
   a second device; and
   a bulk metallic glass solder material disposed in substantial contact with the first device and the second device to physically couple the two devices, wherein the bulk metallic glass solder material has an alloy composition which undergoes glass formation when the solder material is cooled from at or above the melting temperature ($T_m$) to at or below the glass transition temperature (Tg) at a cooling rate below approximately $10^{2}°$ C./second, and wherein the bulk metallic glass solder material comprises a ternary alloy including at least one of tin (Sn) and indium (In).

7. The article of manufacture of claim 6, wherein the bulk metallic glass solder material further comprises two of bismuth (Bi), zinc (Zn), nickel (Ni), copper (Cu), and silver (Ag).

8. An article of manufacture, comprising:
   a first device;
   a second device; and
   a bulk metallic glass solder material disposed in substantial contact with the first device and the second device to physically couple the two devices, wherein the bulk metallic glass solder material has an alloy composition which undergoes glass formation when the solder material is cooled from at or above the melting temperature ($T_m$) to at or below the glass transition temperature (Tg) at a cooling rate below approximately $10^{2}$° C./second, and wherein the bulk metallic glass solder material comprises an alloy including at least one of indium-bismuth including 60-70 wt. % indium, indium-zinc including 97-99 wt. % indium, indium-nickel including >99 wt % indium, indium-copper including >99 wt % indium, indium-silver including 95-99 wt. % indium, and indium-gold including >99 wt % indium, indium-cadmium including 60-70 wt. % indium, and indium-gallium including 20-30 wt. % indium.

* * * * *

UNITED STATES PATENT AND TRADEMARK OFFICE
CERTIFICATE OF CORRECTION

PATENT NO.         : 7,628,871 B2                                               Page 1 of 1
APPLICATION NO. : 11/203546
DATED              : December 8, 2009
INVENTOR(S)        : Daewoong Suh It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 741 days.

Signed and Sealed this

Twenty-first Day of December, 2010

David J. Kappos
*Director of the United States Patent and Trademark Office*